United States Patent [19]

Maniar et al.

[11] Patent Number: 5,254,217

[45] Date of Patent: Oct. 19, 1993

[54] METHOD FOR FABRICATING A SEMICONDUCTOR DEVICE HAVING A CONDUCTIVE METAL OXIDE

[75] Inventors: Papu Maniar; C. Joseph Mogab, both of Austin, Tex.

[73] Assignee: Motorola, Inc., Schaumburg, Ill.

[21] Appl. No.: 919,328

[22] Filed: Jul. 27, 1992

[51] Int. Cl.$^5$ .................. C23F 1/00; H01L 21/302
[52] U.S. Cl. ..................... 156/656; 437/228
[58] Field of Search ............... 156/656; 437/228

[56] References Cited

U.S. PATENT DOCUMENTS

| | | | |
|---|---|---|---|
| 3,698,078 | 10/1972 | Redington | 437/228 |
| 4,357,369 | 11/1982 | Kilichowski et al. | 437/228 |
| 5,003,428 | 3/1991 | Shepherd | 361/321 |
| 5,118,382 | 6/1992 | Cronin et al. | 437/228 |
| 5,139,974 | 8/1992 | Sandhu et al. | 437/228 |

FOREIGN PATENT DOCUMENTS 2-177509  7/1990  Japan .

OTHER PUBLICATIONS

"Reactions of Oxygen with the Platinum Metals: II–Oxidation of Ruthenium, Rhodium, Iridum and Osmium", J. C. Chaston, Platinum Metals Review, (9), 1965, pp. 51–56.

"Plasma Etching of RuO2 Thin Films", Jpn. J. Appl. Phys. vol. 31 (1992) pp. 135–138, Part 1, No. 1 Jan. 1992.

*Primary Examiner*—Carl F. Dees
*Attorney, Agent, or Firm*—Jasper W. Dockrey

[57] ABSTRACT

A method for patterning a conductive metal oxide film on a substrate surface by means of an oxygen plasma etching process. In one embodiment, a substrate (10) is provided having a ruthenium oxide layer (14) overlying a dielectric layer (12). The substrate is placed on an electrode (24) positioned in a vacuum chamber (20) and the vacuum chamber is evacuated to a low pressure. Oxygen gas is introduced to the vacuum chamber and RF power is applied to form an oxygen plasma within the vacuum chamber. The oxygen plasma preferentially etches the ruthenium oxide layer (14) and does not etch the underlying dielectric layer (12). The oxygen plasma etching process can be used to form high resolution ruthenium oxide features during semiconductor device fabrication of ferroelectric capacitors (60) and other electronic components.

15 Claims, 1 Drawing Sheet

METHOD FOR FABRICATING A SEMICONDUCTOR DEVICE HAVING A CONDUCTIVE METAL OXIDE

FIELD OF THE INVENTION

This invention relates in general to a method for fabricating a semiconductor device, and more particularly to a method for plasma etching a conductive metal oxide layer.

BACKGROUND OF THE INVENTION

The increasing performance requirements for semiconductor devices have led to the development of new materials which will improve the electrical performance of the devices. In recent years, much of the materials development has centered on electrically conductive materials which can be deposited as a thin film, are oxidation resistant, and provide a barrier to the diffusion of elements through the material. In general, conductive metal oxides meet many of these requirements. Conductive metal oxides include oxides of selected Group VIII metals. One metal oxide which has received considerable attention is ruthenium oxide. Ruthenium oxide possesses many desirable properties such as high electrical conductivity, chemical stability, and oxidation resistance.

While the identification of materials have desirable properties is an important first step, the new material cannot be used in a semiconductor device unless process technology exists to deposit the material and to pattern the material into the necessary geometric structures required for component fabrication. Thus, the introduction of new materials often requires new process technology to fabricate semiconductor devices incorporating the new material.

In the case of ruthenium oxide, suitable deposition techniques exist; however, etching the ruthenium oxide once deposited has proven difficult. For a new material to have any utility in a semiconductor device, the material must be capable of being patterned by a high resolution photolithographic and etching process. However, ruthenium oxide is an especially resilient material which is not soluble in many common liquid etchants. Additionally, attempts at dry etching have been generally unsatisfactory. However, some success has been attained by the dry etching of ruthenium oxide using fluorinated carbon compounds. In addition, sputter etching using noble gases such as argon removes ruthenium oxide, but at a low etch rate.

An important characteristic of an etch process to be used for advanced semiconductor devices is that the etch preferentially removes ruthenium oxide without etching an underlying dielectric material. While plasma etching with a fluorinated gas or argon gas provides a dry etching technique, fluorinated carbon compounds, such as carbon tetrafluoride, are known to also rapidly etch many dielectric materials, such as silicon oxide, silicon nitride, and the like. Additionally, plasma etching with carbon tetrafluoride is known to have a high lateral etch rate under almost all RF power and vacuum pressure conditions. Lateral etching is undesirable because it undermines the edges of the patterning material used to define features on the substrate surface. Furthermore, sputter etching is non-selective to underlying materials because of the high ion energy created by the sputter etching apparatus. Therefore, a suitable etching process must be capable of high etch selectivity to underlying layers and provide high resolution pattern transfer.

BRIEF SUMMARY OF THE INVENTION

In practicing the present invention, there is provided a method for fabricating a semiconductor device having a conductive metal oxide layer. In one embodiment, a substrate is provided having a metal oxide film disposed on the surface of the substrate. The metal oxide film is etched in an oxygen gas plasma. The oxygen plasma reacts with the metal oxide producing volatile reaction products, but does not react with the underlying substrate material. The oxygen plasma etch is carried out under etching conditions which provide a high resolution metal oxide pattern for use in a semiconductor device structure.

DETAILED DESCRIPTION OF PREFERRED EMBODIMENTS

Figure 1:
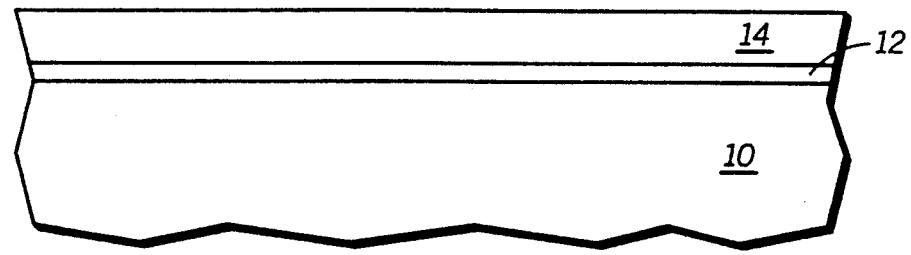
FIG. 1 illustrates, in cross-section, a representative semiconductor structure to which the invention applies.

Shown in FIG. 1, is a portion of a semiconductor substrate 10 having a dielectric layer 12 overlying substrate 10, and a metal oxide layer 14 overlying dielectric layer 12. Metal oxide layer 14 is an oxide of a noble metal having the general formula $MO_x$, where x is two or three, and M is a noble metal. As used herein, a noble metal is a Group VIII metal exclusive of platinum and palladium. The group of noble metals contemplated by the present invention includes ruthenium (Ru), iridium (Ir), rhodium (Rh), and osmium (Os). The structure illustrated in FIG. 1 represents one example of many possible semiconductor structures in which a noble metal layer can be present. Such a structure may occur, for example, in the fabrication of high-performance non-volatile memory devices incorporating a lead lanthanum zirconium titanate (PLZT) ferroelectric thin film. FIG. 1, while not necessarily depicting any actual semiconductor device structure, serves to illustrate the application of the invention to the fabrication of a semiconductor device.

Dielectric layer 12 can be one of several dielectric materials such as silicon dioxide, silicon nitride, oxynitride, and the like. Alternatively, dielectric layer 12 can be any composite material, such as, for example, an ONO layer comprised of individual layers of silicon oxide, silicon nitride, and silicon oxide. Additionally, dielectric layer 12 can be a ceramic dielectric material such as lead zirconium titanate (PZT), lead lanthanum zirconium titanate (PLZT), strontium titanate, barium titanate, and the like.

Metal oxide layer 14 can be formed by reactive sputter deposition or chemical vapor deposition of a noble metal. For example, in one embodiment, metal oxide layer 14 is ruthenium dioxide ($RuO_2$). Preferably, $RuO_2$ is formed by DC reactive sputter deposition of Ru. The sputtering process is carried out in a low pressure oxygen and argon atmosphere using a pure ruthenium sputtering target. The argon and oxygen are present in the ratio of about 60 vol. percent argon and about 40 vol.

percent oxygen. The sputtering process is initiated by applying about 400 watts of DC power at a system pressure of about 8 millitorr. The $RuO_2$ film is sputter deposited to a thickness of about 50 nanometers and has a sheet resistance of about 120 to 150 ohms per square. Analysis by Rutherford backscattering spectroscopy (RBS) of the $RuO_2$ film indicates the stoichiometric material composition to be 2.03 to 2.10 atoms of oxygen for every atom of ruthenium.

In an alternative method, metal oxide layer 14 can be formed by organometallic chemical vapor deposition of a noble metal followed by an oxidation step. For example, Ru can be deposited by chemical vapor deposition of an organoruthenium complex such as bis(cyclopentadienyl) ruthenium (Ru $(C_5H_5)_2$), triruthenium dodecacarbonyl ($Ru_3(CO)_{12}$), and the like, or alternatively, a halogenated compound such as ruthenium tetrachloride ($RuCl_4$). The Ru film is then oxidized in an oxygen atmosphere at about 500° to 1000° C.

In accordance with the invention, metal oxide layer 14 is etched in a parallel plate etching apparatus. The parallel plate etching apparatus is capable of controlling the internal atmospheric environment of the etch chamber, and applying RF power at 13.56 MHz to a pair of parallel opposing electrodes positioned within the etch chamber. In addition, the etching system is capable of controlling substrate temperature in a range from about 25° C. to 150° C. and has an RF power capacity ranging from 50 to 400 Watts. Many commercially available plasma etching systems have the necessary environmental control and RF power delivery capability to provide the aforementioned operating ranges.

Figure 2:
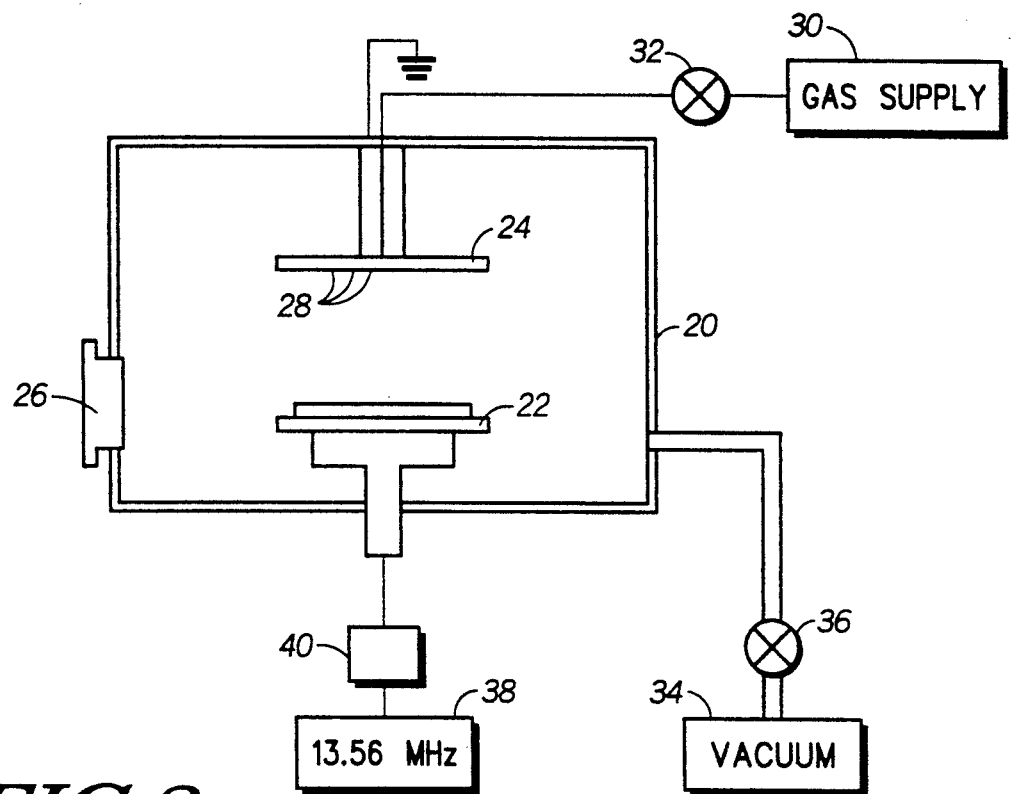
FIG. 2 is a composite cross-sectional schematic diagram of a plasma etching apparatus suitable for use in practicing the present invention.

One example of a plasma etching apparatus which can be used in practicing the invention is shown in FIG. 2. The apparatus comprises a vacuum chamber 20 which encloses a lower powered electrode 22 and an upper grounded electrode 24. Wafers to be etched are loaded into vacuum chamber 20 by means of an access door 26 and placed upon powered electrode 22. Processed wafers are removed from vacuum chamber 20 also by means of access door 26.

Inside chamber 20, electrodes 22 and 24 have generally planar surfaces and are parallel to one another. Both powered electrode 22 and grounded electrode 24 are electrically insulated from the walls of chamber 20. Grounded electrode 24 is adapted to dispense process gasses into the space between the two electrodes through a plurality of openings 28 in the lower surface of the electrode. A gas supply 30 and flow control valve 32 are coupled to electrode 24 in order to select and regulate the flow of gases to chamber 20. A vacuum system 34 is coupled through a pressure control valve 36 to chamber 20 to control the pressure therein and remove excess gaseous reaction products therefrom.

The gases introduced to chamber 20 are energized by means of a 13.56 MHz power supply 38 coupled to electrode 22 through a matching network and blocking capacitor unit 40. The components described thus far are recognized by those skilled in the art as comprising a reactive ion etching (RIE) system. Gas introduced into the space between the two electrodes is excited to a high energy state by the RF energy emitted from power supply 38.

In operation, semiconductor substrate 10, having metal oxide layer 14 thereon is placed on powered electrode 22. Door 26 is closed and vacuum system 34 removes the atmospheric gases from chamber 20. Flow control valve 32 is activated to introduce oxygen gas into chamber 20, and the internal pressure is adjusted to a level selected for optimum operation, preferably about 1 to 100 millitorr. Oxygen is introduced at a rate of about 10 to 100 sccm through flow control valve 32. Power supply 38 is activated imparting 50 to 400 watts of RF power at electrode 22 and igniting a plasma in the space between the two electrodes. Once a plasma is formed, an ion assisted chemical reaction takes place between the oxygen plasma and the metal oxide film. The plasma induced chemical reaction etches away the metal oxide layer 14 overlying dielectric layer 12. During the reaction, the temperature of substrate 12 is controlled to a temperature in the range of 25° to 50° C. The reaction of oxygen with the metal oxide produces volatile reaction products which are removed by vacuum system 34. After a predetermined time, power supply 38 is shut off and chamber 20 is back-filled with an inert gas from gas supply 30 until the internal pressure is equalized to atmospheric pressure. Semiconductor substrate 10 is then removed from electrode 22 through door 26.

Alternatively, other kinds of etching apparatus can be used, such as a hexagonal bell-jar type reactor, a barrel reactor, a multi-chamber parallel plate reactor, and the like. In addition, an electron-cyclotron resonance type etching reactor can also be used. The particular style of etching system used will depend upon the specific etch characteristics that are desired. For example, in cases where the substrate is sensitive to applied voltage, an electron-cyclotron resonance reactor can be used. Additionally, a barrel reactor can be used in cases where the metal oxide film is to be isotropically etched. Those skilled in the art recognize that in each particular type of etching system, the operating conditions, such as RF power, vacuum pressure, and oxygen flow rate must be adjusted to optimize the etching process.

Figure 3:
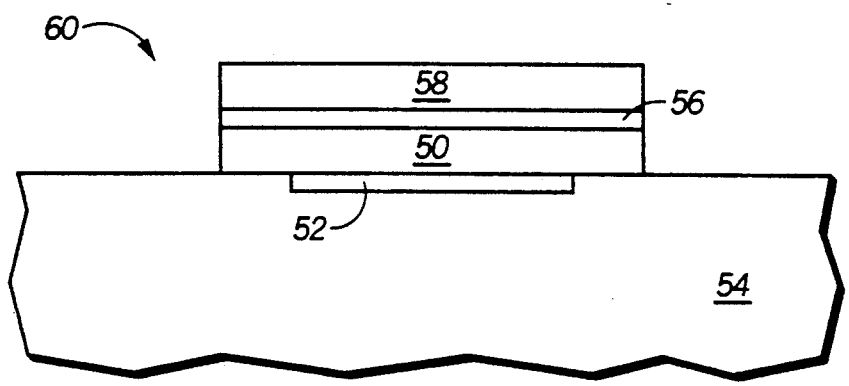
FIG. 3 illustrates, in cross-section, a ferroelectric capacitor fabricated in accordance with the invention.

While the structure shown in FIG. 1 serves to illustrate the application of the invention to semiconductor device fabrication, the invention contemplates the fabrication of more complex structures. For example, the high resolution patterning capability of the invention enables the fabrication of a wide variety of integrated circuit components having a metal oxide conductor. One such component is a capacitor having metal oxide plates as illustrated in FIG. 3. In one embodiment, a $RuO_2$ bottom plate 50 overlies a doped region 52 formed in a semiconductor substrate 54. A dielectric layer 56 overlies bottom plate 50 and a $RuO_2$ top plate 58 overlies dielectric 56. Bottom and top plates 50 and 58 and intermediate dielectric layer 56 form a thin-film capacitor 60. In cases where it is desired to prevent interdiffusion of dopant atoms from the substrate into the bottom plate, a barrier metal layer such as titanium nitride or titanium tungsten can be disposed between the substrate and the bottom capacitor plate.

For purposes of illustrating the invention, a capacitor having $RuO_2$ plates is depicted in FIG. 3; however, those skilled in the art will appreciate that the capacitor plates can be constructed from a different noble metal oxide having the general formula given above. For example, the plates can be $RhO_2$, $IrO_2$, and the like.

In one embodiment, capacitor 60 is formed by first depositing a $RuO_2$ layer using the DC reactive sputter deposition process previously described. After the first $RuO_2$ layer is deposited, the layer is annealed and a dielectric layer is formed to overlie the first $RuO_2$ layer. The dielectric layer can be one of a number of different dielectric materials commonly used in thin-film capacitors. For example, the dielectric material can be similar to that of dielectric layer 12, e.g. silicon oxide or oxynitride and the like. Alternatively, the dielectric material can be one of the ceramic dielectric materials previously described, e.g. PZT, PLZT, strontium titanate, and barium titanate, and the like.

In one embodiment of the invention, capacitor 60 is a ferroelectric capacitor having a PLZT dielectric material. The PLZT layer is preferably formed by spin-coating a PLZT sol-gel solution onto substrate 54. The sol-gel solution includes complex molecules of lead, lanthanum, and zirconium titanate. Following spin-coating, substrate 54 is baked and sintered to form a crystalline PLZT perovskite. Alternatively, the PLZT layer can be formed by sputter deposition, or chemical vapor deposition, or the like. After the PLZT layer is deposited, a second layer of $RuO_2$ is deposited to overlie the PLZT layer.

To complete the fabrication of capacitor 60, a high resolution etch process is required to define the first and second $RuO_2$ layers and the intermediate PLZT layer. Capacitor 60 must have the necessary geometric characteristics to be integrated into a complex semiconductor device such as an ultra-large-scale-integrated circuit. The fabrication of capacitor 60 requires that the etch process not only be capable of high resolution, but also be highly selective to underlying layers. For example, it is required that the etching of the first $RuO_2$ layer proceed to the interface between the first $RuO_2$ layer and substrate 54 without unduly etching away the surface of substrate 54. The formation of capacitor 60 additionally requires that the etch process not remove portions of the etching mask used to define the pattern of capacitor 60 on substrate 54. Furthermore, it is important that the etch process not degrade the dielectric characteristics of the PLZT layer by subjecting the PLZT layer to excessive voltages during the etching of any portion of capacitor 60.

Accordingly, the process of the present invention is used to etch the $RuO_2$ layers and the intermediate PLZT layer. First, an etch masking pattern is formed on the second $RuO_2$ layer. Preferably, a positive acting photoresist material, which is resistant to being etched by an oxygen plasma, is used. In one method, a polyvinyl phenol is treated with hexamethyldisilazane to form a silylated resist which is then deposited onto substrate 54. The silylated resist is exposed and dry developed to form the desired pattern. Alternatively, a silicon implantation process can be used to impregnate polyvinyl phenol with silicon. In another alternative, a hard mask can be used. Because oxygen is unreactive with many thin-film materials, a material other than an organic photoresist can be used as an etch mask. For example, a refractory metal, a refractory metal silicide, a refractory metal oxide, or a semiconductor, such as polysilicon, can be used as an etch mask. Refractory metals include tungsten (W), titanium (Ti), molybdenum (Mo), and the like. Refractory metal oxides include titanium dioxide ($TiO_2$), and tantalum pentoxide ($Ta_2O_5$), and the like. Those skilled in the art appreciate that the large variety of materials, which can be used as a mask for the oxygen etching of metal oxide layer 14, is a particular advantage of the present invention.

After forming a masking pattern to define the area of capacitor 60, the second $RuO_2$ layer is etched to form top plate 58 using the previously described oxygen plasma process. Since PLZT is substantially unreactive with oxygen, the oxygen plasma does not appreciably etch the underlying PLZT layer. The preferential etching of $RuO_2$ is advantageous because an extended amount of time can be used, if necessary, to remove all of the exposed $RuO_2$ layer. Over-etching is desirable in cases where the $RuO_2$ layer is deposited over existing structures already in place on substrate 54. For example, regions where the $RuO_2$ layer overlies steep edges require an extended etching time to remove all of the $RuO_2$ overlying those edges.

Once top plate 58 has been defined, the PLZT layer is etched to form dielectric layer 56. Preferably, a wet etching process is used to etch the PLZT layer. In one method, a solution of hydrogen fluoride and hydrogen chloride is maintained in a constant temperature bath. A photoresist pattern can be formed on top plate 58 to define a desired pattern. Alternatively, top plate 58 can be used as a hard mask for the PLZT etch process. Substrate 54 is immersed in the bath for a predetermined period of time removing all unprotected portions of the PLZT layer. In an alternative method, a dry plasma etching process is used to etch the PLZT layer. The plasma etch can be carried out in a system similar to that illustrated in FIG. 2. The PLZT layer is plasma etched with halogenated etch gases such as a chlorinated gas at temperatures above about 150° C.

Following the formation of dielectric 56, the first $RuO_2$ layer is etched to form bottom plate 50. Again, the previously described oxygen plasma etching process is used to etch the first $RuO_2$ layer. In addition to preferentially etching $RuO_2$ deposited over PLZT, the oxygen etch will also preferentially etch $RuO_2$ deposited over silicon. As in the previous process for etching the second $RuO_2$ layer, a substantial over-etch can also be performed here to remove all portions of the first $RuO_2$ layer. Thus, a particular advantage of the process of the present invention relates to the high degree of etching selectivity toward the various materials used to form ferroelectric capacitors.

Those skilled in the art recognize that the particular applications of the invention are not limited to the formation of a ferroelectric capacitor. The process of the invention can be used to form a variety of integrated circuit components having a metal oxide layer. For example, a conductive metal oxide can be used to form thin-film resistors. Thin-film resistors have widespread applications in electronic components such as sensors, resistor arrays, hybrid integrated circuits, and the like. Because a noble metal oxide is resistant to oxidation, such a material is advantageous in a semiconductor device structure or electronic component whenever an oxygen anneal must be performed during processing.

Without further elaboration, it is believed that one skilled in the art can, using the preceding description, utilize the invention to its fullest extent. The following specific embodiments are, therefore, to be construed as merely illustrative, and not limiting in any way whatsoever.

EXAMPLE I

A silicon substrate having a 50 nanometer thick $RuO_2$ film to be etched was placed on the lower electrode of a parallel plate etching apparatus manufactured by Plasma-Therm Inc. of Kresson, N.J. The etch chamber was evacuated to a pressure of 45 millitorr and the substrate was heated to 35° C. Oxygen gas was introduced at the rate of 50 standard cubic centimeters per minute and 200 watts of RF power was applied to the lower electrode at a frequency of 13.56 MHz. The application of the RF power to the lower electrode created a DC bias of about −516 volts at the electrode. The removal of the $RuO_2$ film was monitored by periodically removing the substrate from the etch chamber and measuring the sheet resistance. Substantially all of the $RuO_2$ was removed after an etching period of 10 minutes. The average etch rate of the $RuO_2$ film was 57 angstroms per minute.

EXAMPLE II

A silicon substrate having a 50 nanometer thick $RuO_2$ film to be etched was placed on the lower electrode of the apparatus described in Example I. The etch chamber was evacuated to a pressure of 45 millitorr and the substrate was heated to 35° C. A combination of oxygen and tetrafluoromethane gas was introduced at the rate of 5 sccm oxygen and 45 sccm tetrafluoromethane. Two hundred watts of RF power was applied to the lower electrode at a frequency of 13.56 MHz. The application of the RF power to the lower electrode created a DC bias of about −478 volts at the electrode. The removal of the $RuO_2$ film was monitored using the same method as in Example I. The average etch rate of the $RuO_2$ film was about 2 angstroms per minute.

EXAMPLE III

A silicon substrate having a 50 nanometer thick $RuO_2$ film to be etched was placed on a wafer tray and inserted into a barrel etching apparatus manufactured by Branson IPC, of Hayward, Calif. An initial 10 minute nitrogen plasma was formed by flowing about 500 sccm of nitrogen and applying about 500 watts of RF power. During the nitrogen plasma treatment, the pressure in the etch chamber was adjusted to a pressure of about 1 torr. While maintaining a pressure of about 1 torr, oxygen gas was introduced at the rate of about 100 sccm and about 1000 watts of RF power was applied to the chamber at a frequency of 13.56 MHz. Substantially all of the $RuO_2$ was removed after an etching period of 45 minutes.

The etch results described in the Examples given above indicate that the oxygen plasma etching of an $RuO_2$ film occurs by a plasma-assisted chemical reaction rather than by sputter etching. The etch results obtained with the barrel reactor described in Example III can only be obtained as a result of chemical etching. Because the substrate is at a voltage potential only slightly less than the plasma in a barrel-type reactor, during the etch, ions are not accelerated toward the substrate rapidly enough to sputter material from the substrate surface. Therefore, the etching mechanism is substantially a chemical reaction between activated oxygen atoms and the $RuO_2$ material. Additional evidence of a chemical etch mechanism is provided by the change in etch rate observed when tetrafluoromethane is introduced to the oxygen etch process, as reported in Example II. If the mechanism were sputter etching, a significant change in etch rate would not occur when an additional compound such as tetrafluoromethane is introduced. The chemical nature of the plasma etching process of the present invention is important because high resolution pattern transfer requires that an etching mask be preserved during the etching process. Sputter etching processes typically remove a masking material at about the same rate as the underlying film; therefore, sputter etching is usually not suitable for application to VLSI device fabrication.

Thus it is apparent that there has been provided, in accordance with the invention, a method for fabricating a semiconductor device having a conductive oxide layer which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, additional gases such as halogen compounds and carrier gases such as nitrogen and hydrogen can be used in combination with oxygen as necessary to alter the plasma etching characteristics. It is therefore intended to include within the invention all such variations and modifications as fall within the scope of the appended claims and equivalents thereof.

We claim:

1. A method for fabricating a semiconductor device comprising:
    providing a substrate having a conductive metal oxide film disposed thereon; and
    etching the conductive metal oxide film using an oxygen gas plasma.

2. The method of claim 1, wherein the conductive metal oxide film comprises an oxide of a metal selected from the group consisting of ruthenium, iridium, rhodium, and osmium.

3. The method of claim 2, wherein the ruthenium oxide film comprises an electrically conductive material having a stoichiometric composition of 2.03 to 2.10 atoms of oxygen to every one atom of ruthenium.

4. The method of claim 1, wherein the etching step is carried out in a reactive ion etching apparatus using an RF power of 50 to 400 watts at a pressure of 1 to 100 millitorr.

5. A method for fabricating a semiconductor device comprising:
    providing a substrate;
    forming a dielectric layer on the substrate;
    forming a conductive metal oxide film on the dielectric layer;
    forming a masking pattern on the conductive metal oxide film; and
    etching the conductive metal oxide film in an oxygen plasma to form a patterned conductive metal oxide layer overlying the dielectric layer.

6. The method of claim 5 further comprising etching the dielectric layer using the patterned conductive metal oxide layer as an etching mask.

7. The method of claim 5, wherein the conductive metal oxide film comprises an oxide of a metal selected from the group consisting of ruthenium, iridium, rhodium, and osmium.

8. The method of claim 7, wherein the step of forming a ruthenium oxide film comprises sputter deposition from a ruthenium target in an ambient including oxygen.

9. The method of claim 5, wherein the masking pattern is a hard mask comprises an inorganic material selected from the group consisting of a refractory metal, a refractory metal silicide, a refractory metal oxide, and polysilicon.

10. The method of claim 5, wherein the masking pattern comprises an organic photoresist material selected from the group consisting of an organic photoresist and a silylated organic photoresist.

11. A method for fabricating a semiconductor device comprising:
    providing a semiconductor substrate;
    forming a doped region in the substrate;

depositing a first ruthenium oxide layer to overlie the doped region;

depositing a dielectric layer;

depositing a second ruthenium oxide layer to overlie the dielectric layer;

forming a masking pattern on the second ruthenium oxide layer; and sequentially etching the second ruthenium oxide layer, the dielectric layer, and the first ruthenium oxide layer using the masking pattern as an etching mask, wherein the first and second ruthenium oxide layers are etched in an oxygen plasma.

12. The method of claim 11, wherein the masking pattern comprises a material selected from the group consisting of an organic photoresist and a silylated organic photoresist.

13. The method of claim 11, wherein the masking pattern comprises a material selected from the group consisting of a refractory metal, a refractory metal silicide, and a refractory metal oxide.

14. The method of claim 11, wherein the dielectric layer comprises a ceramic dielectric material selected from the group consisting of lead lathanum zirconium titanate, lead zirconium titanate, strontium titanate, and barium titanate.

15. The method of claim 11, wherein the dielectric layer comprises a dielectric material selected from the group consisting of silicon oxide, silicon nitride, ONO, and an oxynitride.

* * * * *